US010020189B2

United States Patent
Ko et al.

(10) Patent No.: US 10,020,189 B2
(45) Date of Patent: *Jul. 10, 2018

(54) GROWING A III-V LAYER ON SILICON USING ALIGNED NANO-SCALE PATTERNS

(71) Applicant: Taiwan Semiconductor Manufacturing Company, Ltd., Hsinchu (TW)

(72) Inventors: Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/463,047

(22) Filed: Mar. 20, 2017

(65) Prior Publication Data

US 2017/0194141 A1 Jul. 6, 2017

Related U.S. Application Data

(63) Continuation of application No. 12/842,546, filed on Jul. 23, 2010, now Pat. No. 9,601,328.

(Continued)

(51) Int. Cl.
| | |
|---|---|
| *H01L 21/02* | (2006.01) |
| *H01L 29/04* | (2006.01) |
| *H01L 29/06* | (2006.01) |
| *H01L 29/66* | (2006.01) |
| *H01L 21/762* | (2006.01) |

(52) U.S. Cl.
CPC .. *H01L 21/02546* (2013.01); *H01L 21/02381* (2013.01); *H01L 21/02433* (2013.01); *H01L 21/02609* (2013.01); *H01L 21/02639* (2013.01); *H01L 21/76224* (2013.01); *H01L 29/045* (2013.01); *H01L 29/0665* (2013.01); *H01L 29/66522* (2013.01)

(58) Field of Classification Search
CPC ......... H01L 21/02546; H01L 21/02381; H01L 21/02433; H01L 21/02609; H01L 21/02639; H01L 29/045; H01L 29/66522
See application file for complete search history.

(56) References Cited

U.S. PATENT DOCUMENTS

| | | | |
|---|---|---|---|
| 6,437,381 | B1 | 8/2002 | Gruening et al. |
| 7,626,246 | B2 | 12/2009 | Lochtefeld et al. |

(Continued)

FOREIGN PATENT DOCUMENTS

| | | | |
|---|---|---|---|
| JP | 2067723 | A | 3/1990 |
| JP | 5017278 | A | 1/1993 |

(Continued)

*Primary Examiner* — Karen Kusumakar
(74) *Attorney, Agent, or Firm* — Slater Matsil, LLP

(57) ABSTRACT

A method of forming an integrated circuit structure includes providing a wafer having a silicon substrate; forming a plurality of shallow trench isolation (STI) regions in the silicon substrate; and forming recesses by removing top portions of the silicon substrate between opposite sidewalls of the plurality of STI regions. Substantially all long sides of all recesses in the silicon substrate extend in a same direction. A III-V compound semiconductor material is then epitaxially grown in the recesses.

20 Claims, 13 Drawing Sheets

Related U.S. Application Data

(60) Provisional application No. 61/249,897, filed on Oct. 8, 2009.

(56) References Cited

U.S. PATENT DOCUMENTS

| | | |
|---|---|---|
| 2001/0045604 A1 | 11/2001 | Oda et al. |
| 2002/0066403 A1 | 6/2002 | Sunakawa et al. |
| 2003/0042555 A1 | 3/2003 | Kitada et al. |
| 2006/0292719 A1 | 12/2006 | Lochtefeld et al. |
| 2008/0001169 A1 | 1/2008 | Lochtefeld |
| 2008/0099785 A1* | 5/2008 | Bai ................... C30B 25/183 257/190 |
| 2008/0111162 A1 | 5/2008 | Yang et al. |
| 2011/0086491 A1 | 4/2011 | Ko et al. |

FOREIGN PATENT DOCUMENTS

| | | |
|---|---|---|
| JP | 200226143 A | 1/2002 |
| JP | 2003037061 A | 2/2003 |
| JP | 2003158074 A | 5/2003 |
| JP | 2008546181 A | 12/2008 |
| JP | 2009503871 A | 1/2009 |
| WO | 2006125040 A1 | 11/2006 |

* cited by examiner

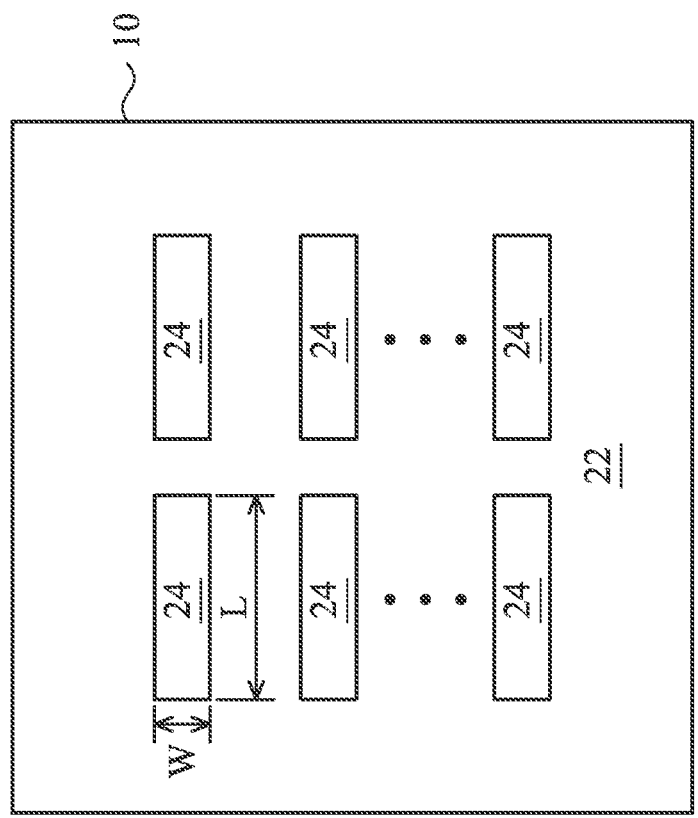
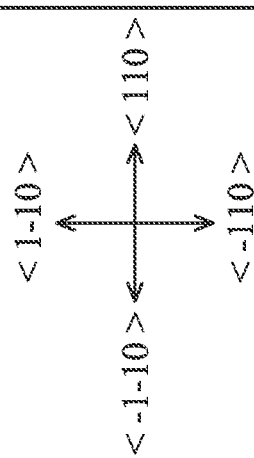
FIG. 1

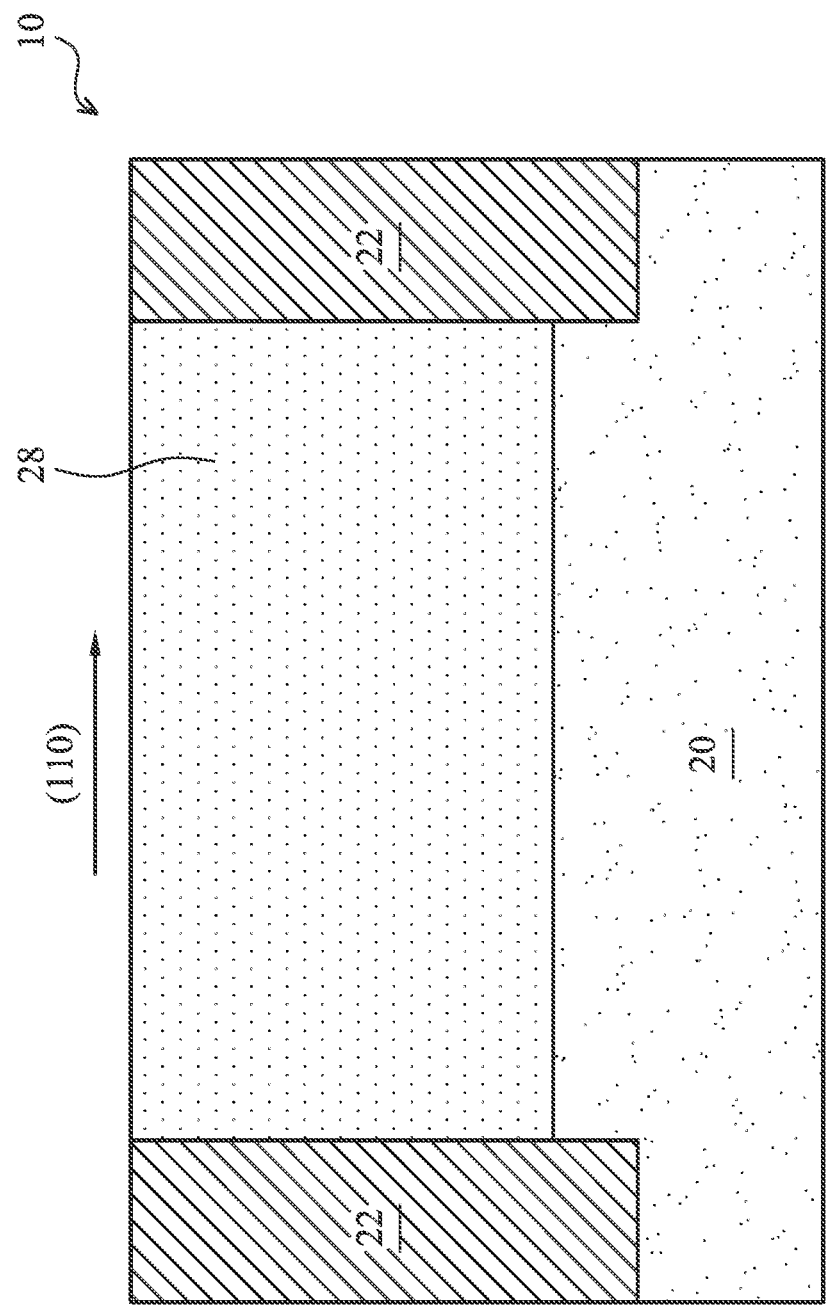

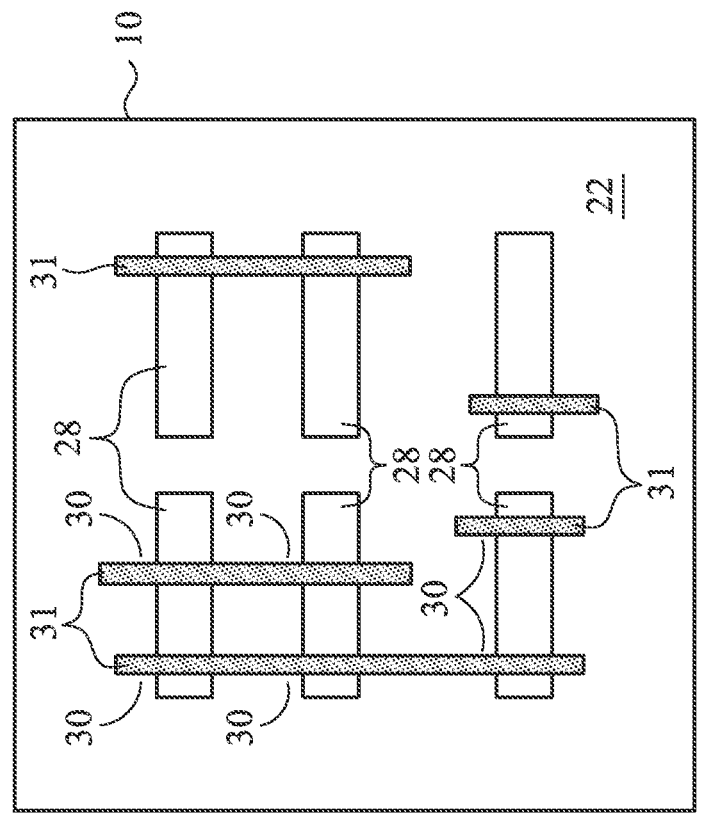
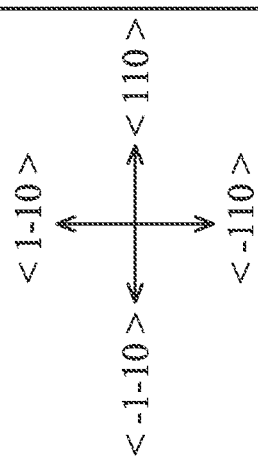
FIG. 6

GROWING A III-V LAYER ON SILICON USING ALIGNED NANO-SCALE PATTERNS

This application is a continuation of U.S. patent application Ser. No. 12/842,546, filed on Jul. 23, 2010, entitled "Growing a III-V Layer on Silicon using Aligned Nano-Scale Patterns," which application claims the benefit of U.S. Provisional Application No. 61/249,897 filed on Oct. 8, 2009, entitled "Growing a III-V Layer on Silicon using Aligned Nano-Scale Patterns," which applications are hereby incorporated herein by reference.

TECHNICAL FIELD

This disclosure relates generally to integrated circuit structures, and more particularly, to growing III-V semiconductor materials having reduced defects.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high. Compound semiconductor materials of group III and group V elements (referred to as III-V compound semiconductors hereinafter) are thus good candidates for forming NMOS devices for their high electron mobilities.

A current problem posted to the manufacture of III-V compound semiconductor thin films is the difficulty in the formation process. Currently, there is no feasible bulk growth method. Therefore, III-V compound semiconductors are commonly formed by epitaxially growing films on substrates such as Si or SiC substrates. However, the existing available substrate materials do not have lattice constants and thermal expansion coefficients closely matching that of III-V compound semiconductors. For example, the lattice constant of silicon is about 5.43 Å, while the lattice constant of GaAs, which is the commonly used III-V compound semiconductors, is 5.65 Å, and the lattice constants of InAs and InSb are 6.06 Å and 6.48 Å, respectively. As a result, the resulting III-V compound semiconductors grown from other non III-V substrates suffer from high defect densities. Various methods were thus explored to reduce the defect densities in the grown III-V compound semiconductors. A known method is to form recesses in shallow trench isolation regions, and then grow the III-V compound semiconductors in the recesses. Although the III-V compound semiconductors formed using this method generally have lower defect densities than the III-V compound semiconductors grown from blanket silicon wafers, the defect densities were still often high.

SUMMARY

In accordance with one aspect of the embodiment, a method of forming an integrated circuit structure includes providing a wafer having a silicon substrate; forming a plurality of shallow trench isolation (STI) regions in the silicon substrate; and forming recesses by removing top portions of the silicon substrate between opposite sidewalls of the plurality of STI regions. Substantially all long sides of all recesses in the silicon substrate extend in a same direction. A III-V compound semiconductor material is then epitaxially grown in the recesses.

Other embodiments are also disclosed.

BRIEF DESCRIPTION OF THE DRAWINGS

For a more complete understanding of the disclosure, and the advantages thereof, reference is now made to the following descriptions taken in conjunction with the accompanying drawings, in which:

FIG. 1 through 6 are top views and cross-sectional views of intermediate stages in the manufacturing of GaAs films and MOS transistors in accordance with an embodiment.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel method of forming compound semiconductor materials comprising group III and group V elements (referred to as III-V compound semiconductors hereinafter) is provided. The intermediate stages of manufacturing an embodiment are illustrated. The variations of the embodiment are then discussed. Throughout the various views and illustrative embodiments, like reference numbers are used to designate like elements.

Figure 2A:
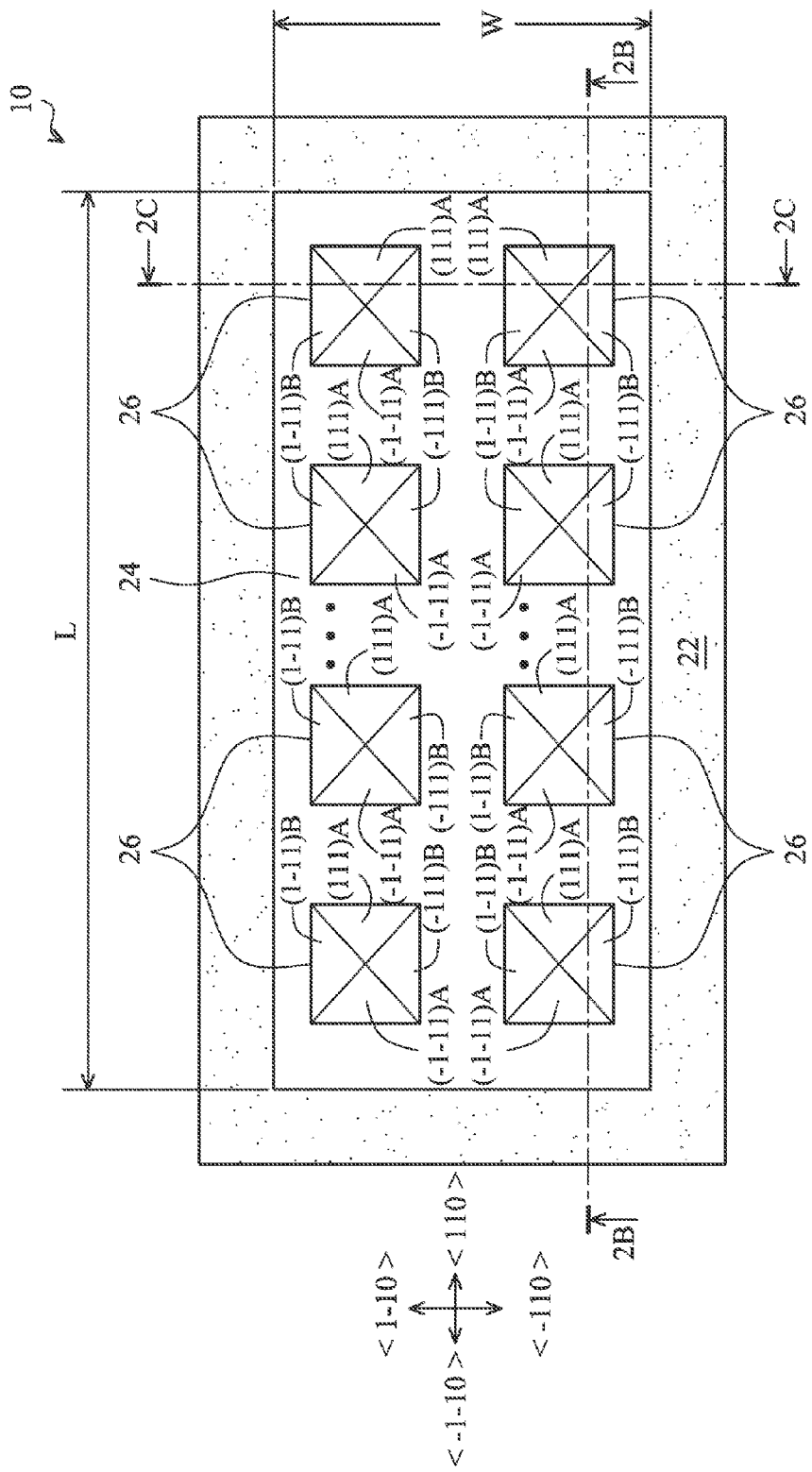
Figure 2B:
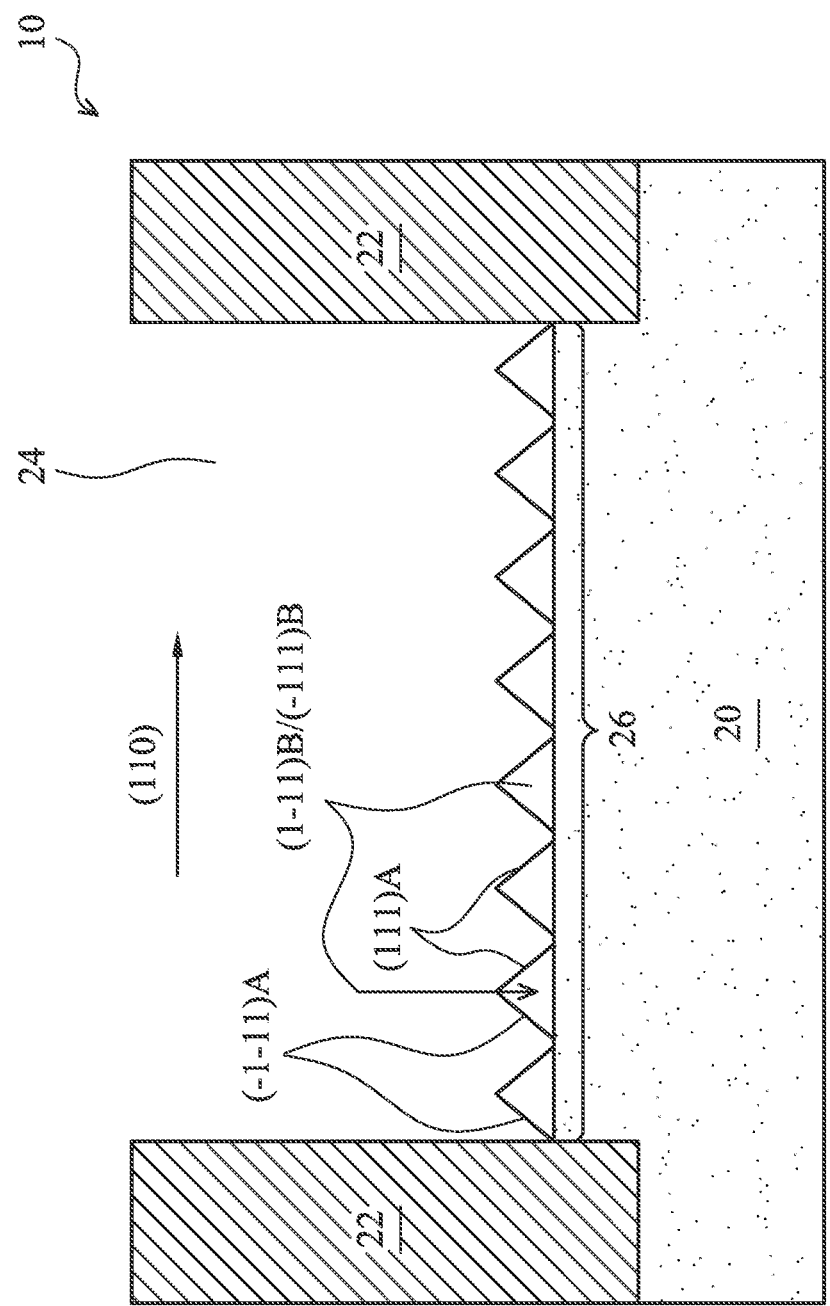
Figure 2C:
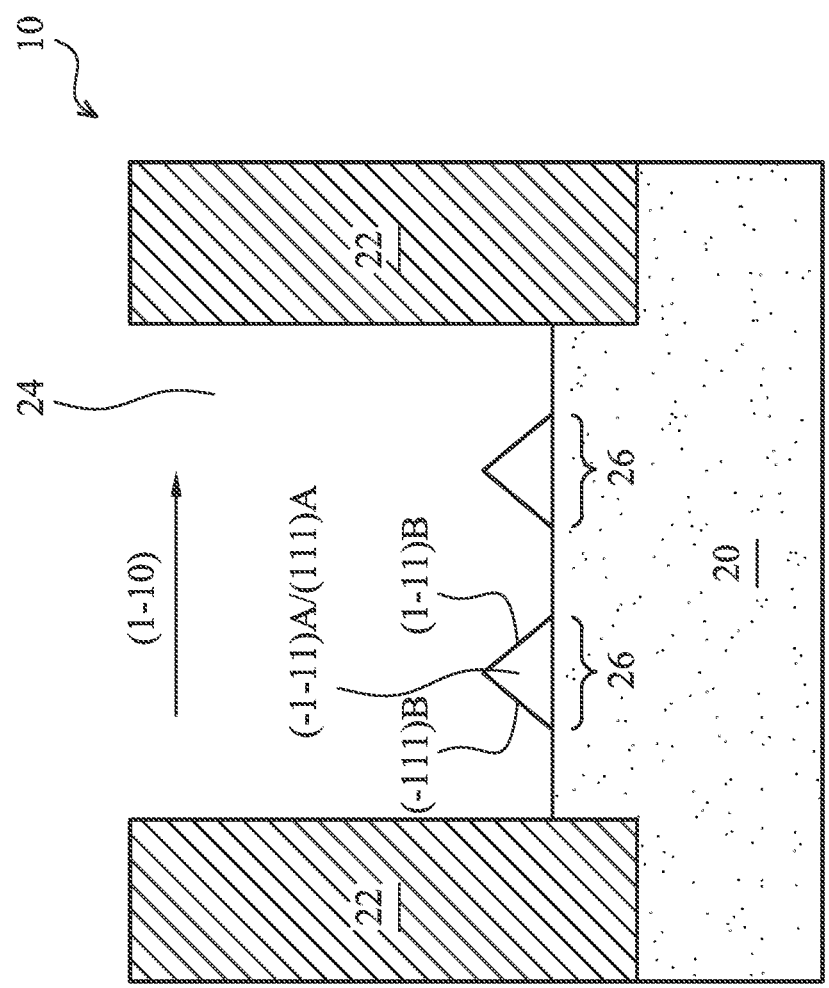

FIG. 1 illustrates a top view of wafer 10, which includes silicon substrate 20 (not shown in FIG. 1, please refer to FIGS. 2B and 2C). The structures shown in the drawings also represent the structures in chips in wafer 10. In an embodiment, the surface orientation of silicon substrate 20 is (001), although other surface orientations may also be used. Shallow trench isolation (STI) regions 22 are formed in silicon substrate 20 to define device regions. A plurality of recesses 24 (FIGS. 1, 2B, and 2C) is formed by recessing the portions of silicon substrate 20 defined by STI regions 22. Each of the recesses 24 may have a long side (with the respective dimension denoted as length L) and a short side (with the respective dimension denoted as width W). Widths W are no greater, and may be smaller than the respective lengths L. Widths W may be at a nano level, for example, less than about 50 nm, or even less than about 20 nm. Lengths L, on the other hand, may be greater than about 50 nm, although it may also be close to, or equal to, the respective widths W. In an embodiment, substantially all, for example, more than 90 percent of, the long sides of all recesses 24 in wafer 10 (or wafer) (and having MOS devices thereon) extend in a same direction. In the exemplary embodiment shown in FIG. 1, substantially all long sides of recesses 24 extend in a <110> direction and a <-1-10> direction, which is the opposite direction of the <110> direction. It is noted that the lengths L of recesses 24 may be equal to or different from each other, although they extend in the same direction. The widths W of recesses 24 may also be different from each other, although they also extend in the same direction.

FIG. 2A illustrates a top view of a portion of wafer 10 including one of recesses 24. The short side of recess 24 extends along a <1-10> direction and a <-110> direction, which is the opposite direction of the <1-10> direction. The long side of recess 24 extends along the <110> direction and the <-1-10> direction. A hetero-epitaxy (epitaxial growth) is then performed to grow a III-V compound semiconductor material in recesses 24 and on silicon. In the following discussion, GaAs is used as an exemplary III-V compound semiconductor material to explain the concept of the embodiments, although other III-V compound semiconductor materials may also be formed.

In the beginning of the epitaxy, supercritical nuclei are formed as islands 26 (the squares in recess 24). The respective stage is referred to as a nucleation stage. It is realized that due to the different energies on different surface orientations, facets are formed on islands 26, and hence the resulting islands 26 have the shape of a pyramid with four facets. The four facets of the pyramid have surface orientations (1-11)B, (-111)B, (-1-11)A, and (111)A. Facets (1-11)B and (-111)B face the long sides, while facets (-1-11)A and (111)A face the short sides. The meaning of letters A and B are explained in subsequent paragraphs.

FIG. 2B illustrates a cross-sectional view of the structure shown in FIG. 2A, wherein the cross-sectional view is taken along a vertical plane crossing line 2B-2B in FIG. 2A. Facets (1-11)B and (-111) B are thus the facets facing into and facing out of the paper, respectively, while facets (-1-11)A and (111)A are facets facing top-left and top-right, respectively.

FIG. 2C illustrates a cross-sectional view of the structure shown in FIG. 2A, wherein the cross-sectional view is taken along a vertical plane crossing line 2C-2C in FIG. 2A. The respective facets are marked on FIG. 2C, and may be found from FIG. 2A.

As width W of recess 24 is at nano level, the short side of recess 24 may only accommodate some, for example, less than about 4, or even only 2, nano islands 26, as is shown in FIG. 2C, although more nano islands may be accommodated. In the beginning of the epitaxial growth, nano islands 26 are spaced apart from each other. Over time, nano islands 26 grow, and eventually merge with each other and contact the sidewalls of STI regions 22. However, during the growth of nano islands 26, the pyramid shape is maintained until nano islands 26 are merged and/or contact the sidewalls of STI regions 22, at which time, the growth is mainly vertical. FIG. 3 illustrates a resulting GaAs film 28.

Figure 4:
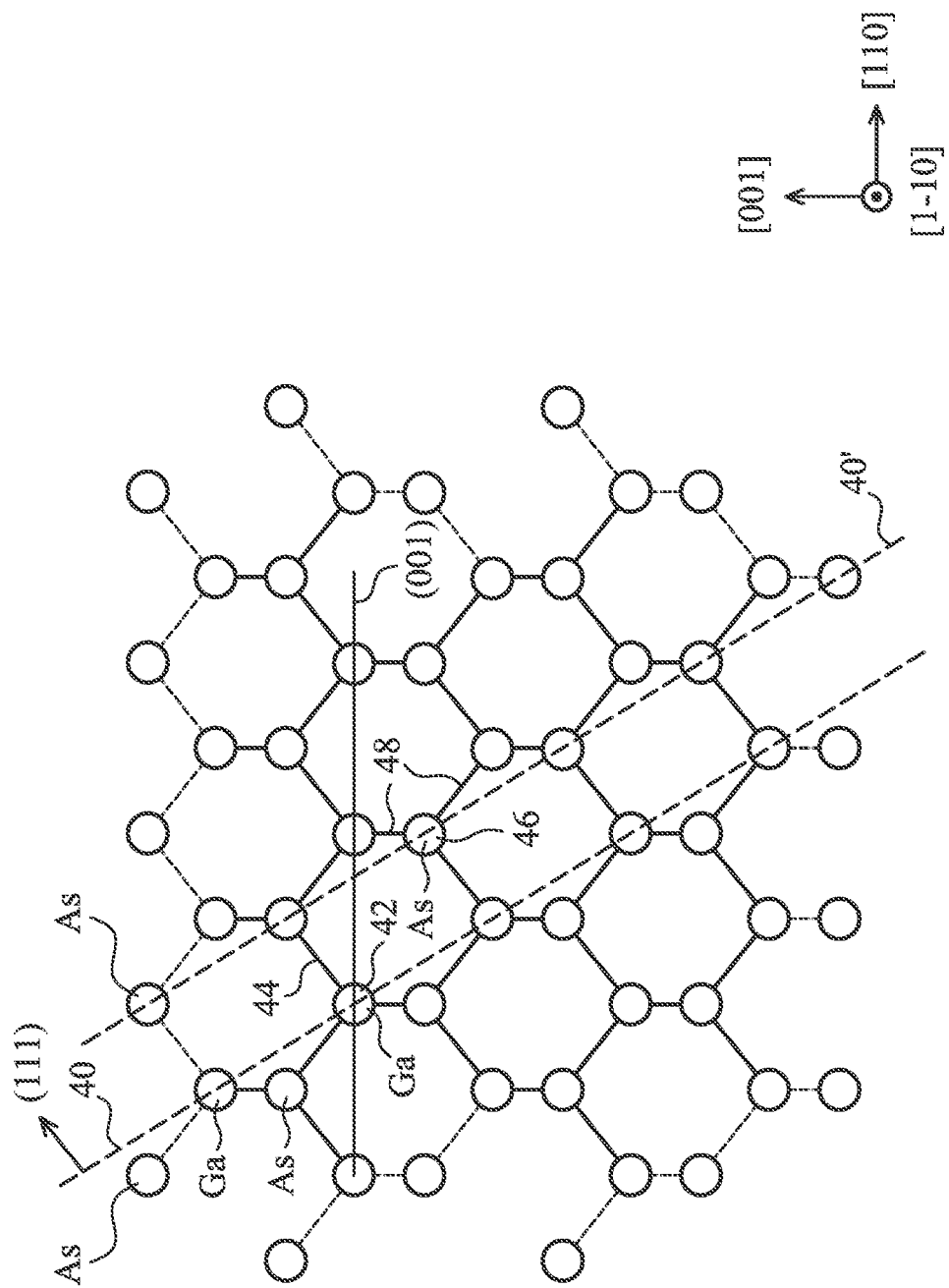

The meaning of letters A and B in facets (FIGS. 2A-2C) are explained as follows using FIGS. 4 and 5, which illustrate the lattice structure of the grown GaAs. The lattice structure shown in FIG. 4 is viewed from the same angle as FIG. 2B (please note the directions marked in FIG. 4). It is observed that, unlike silicon, GaAs is polarized since it has two different types of atoms, Ga atoms and As atoms. Each Ga atom forms four bonds with four As atoms, and each As atom forms four bonds with four Ga atoms. Lines 40 and 40' illustrate possible facets that may be formed during the epitaxial growth, wherein the facets extend into the paper and cross lines 40 and 40', respectively. The facets may grow from bottom-left toward top-right. It is noted that in facet 40, each Ga atom (such as Ga atom 42) has one bond facing up (meaning in the direction out of the respective nano island), which is referred to as an up-bond, and three bonds facing down (meaning in the direction out of the respective nano island), which are referred to as down-bonds hereinafter. Each As atom (such as As atom 46) in facet 40' has three up-bonds 48 and one down-bond 44. Please note that since FIG. 4 shows only a cross-sectional view, only two up-bonds 48 are viewable. Throughout the description, the facets in which each Ga atom has one up-bond 54 (and three down-bonds 56), and each As atom has three up-bonds (and one down-bond) are represented using letter A. Accordingly, referring back to FIG. 2A, facets (-1-11)A and (111)A are post-fixed with letter A, and are referred to as A facets hereinafter.

Figure 5:
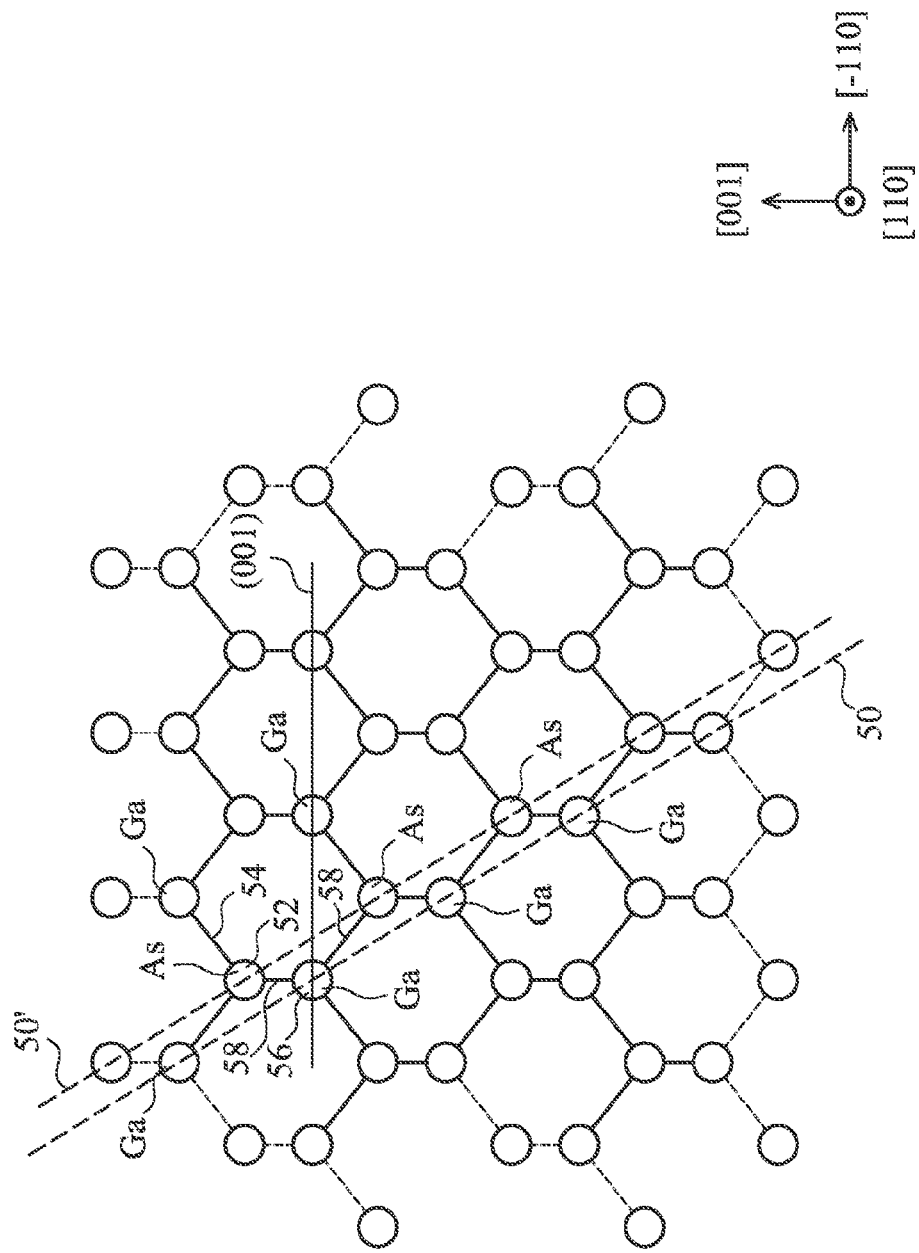

The lattice structure shown in FIG. 5 is viewed from the same angle as FIG. 2C (please note the directions marked in FIG. 5). Lines 50 and 50' illustrate possible facets that may be formed during the epitaxial growth, wherein the facets extend into the paper and cross lines 50 and 50', respectively. The facets may also grow from bottom-left toward top-right. It is noted that each As atom (such as As atom 52) in facet 50' has one up-bond and three down-bonds. Each Ga atom (such as Ga atom 56) in facet 50 has three up-bonds 58 and one down-bond 54 (since FIG. 5 shows only a cross-sectional view, only two up-bonds 58 are shown). The facets in which each As atom has one up-bond (and three down-bonds), and each Ga atom has three up-bonds (and one down-bond) are represented using letter B. Accordingly, referring back to FIG. 2A, facets (1-11)B and (-111) B are post-fixed with letter B, and are referred to as B facets hereinafter.

Referring back to FIG. 2A, A facets and B facets may all have defects, such as stacking faults and twins. The defect densities of A facets and B facets may be different. Whether the A facets or the B facets have a greater defect density than the other, however, is affected by the growth conditions of nano islands 26. It is desirable that the facets with the greater numbers of defects face the long sides of the respective recesses 24, so that these facets may quickly grow to join the sidewalls of STI regions 22, and these high-defect-density facets may be ended. After the facets join the sidewalls of STI regions 22, the growth becomes mainly vertical. The facets with smaller numbers of defects may face the short sides. By controlling the directions of facets, high-quality GaAs films may be grown.

In an embodiment, as shown in FIG. 2A, the long side of recess 24 is along the <110> direction, while the short side is along the <1-10> direction. Accordingly, A facets have a smaller defect density than the B facets. This may be achieved, for example, by adopting a relatively high substrate temperature and/or a relatively low V-to-III flow ratio in the nucleation stage. The V-to-III flow ratio is the ratio of the number of atoms of group III elements to the number of group III elements in the process gases. In the embodiment wherein GaAs is grown, the V-to-III flow ratio is the flow ratio of As atoms in the As-containing process gases to the flow ratio of Ga atoms in the Ga-containing process gases, and hence is also referred to as an As-to-Ga flow ratio. In an exemplary embodiment, the V-to-III ratio is smaller than about 50, or even smaller than about 30. The substrate temperature may be higher than about 400° C., and may be between about 400° C. and about 600° C., or greater than about 500° C., for example, between about 500° C. and about 600° C. Such process conditions result in the improvement in the quality of As bonds, and hence the respective A facets have fewer defects than B facets. Although in this case, B facets have higher defect densities, the B facets will join the sidewalls of STI regions 22 quickly, and the high-density facets are stopped. The overall quality of GaAs is thus improved.

It is appreciated that the above-discussed V-to-III flow ratio and the substrate temperature are used during the nucleation stage, that is, when nano islands 26 still have pyramid shapes. After the nucleation stage, the continued formation of GaAs film 28 (FIG. 3) may be performed under a same V-to-III flow ratio as, or a different V-to-III flow ratio than, the V-to-III flow ratio in the nucleation stage. Similarly, the continued formation of GaAs film 28 may be performed at a same substrate temperature as, or a different substrate temperature than, the substrate temperature in the nucleation stage.

After the formation of GaAs film 28 (FIG. 3), MOS devices 30 are formed, as is shown in FIG. 6. The channel length direction of MOS devices 30 may be in the long side direction of recesses 24 (and hence GaAs films 28). In other words, gate electrodes 31 may extend in the short side direction of GaAs films 28. Accordingly, substantially all MOS devices in wafer 10 that are formed on the epitaxy GaAs films 28 may have their gate electrodes 31 extending in a same direction, and may be parallel to the short side of GaAs films 28. If there are other MOS devices that are in wafer 10 and formed on silicon rather than on III-V compound semiconductor films, those MOS devices may have their gate electrodes extending in any direction, either parallel, or perpendicular, to the direction of gate electrodes 31. Further, if there are GaAs films such as dummy GaAs films that do not have MOS devices formed thereon, the long-side directions of these GaAs films may also extend in any direction.

Figure 7:
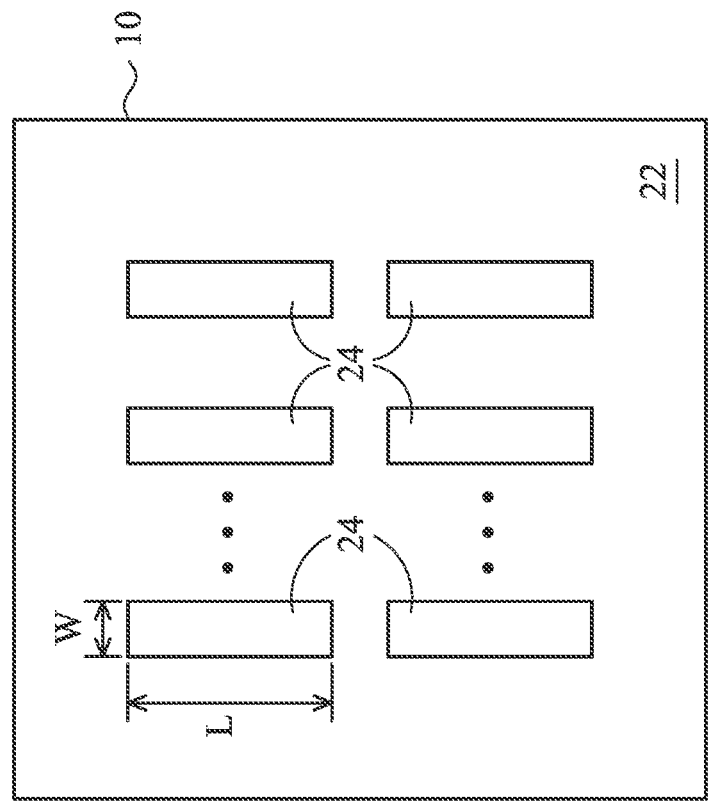
FIGS. 7 through 9 are top views and cross-sectional views of intermediate stages in the manufacturing of GaAs films and MOS transistors in accordance with another embodiment.

FIG. 7 illustrates a top view of an alternative embodiment. The top view of the embodiment is similar to the embodiment shown in FIG. 2A, except that the short sides of recesses 24 extend along <110>/<-1-10> directions, and the long sides of recesses 24 extend along <1-10>/<-110> directions. Again, substantially all recesses 24 in wafer 10 (or in the same wafer) have their long sides extending in the same direction.

Figure 8A:
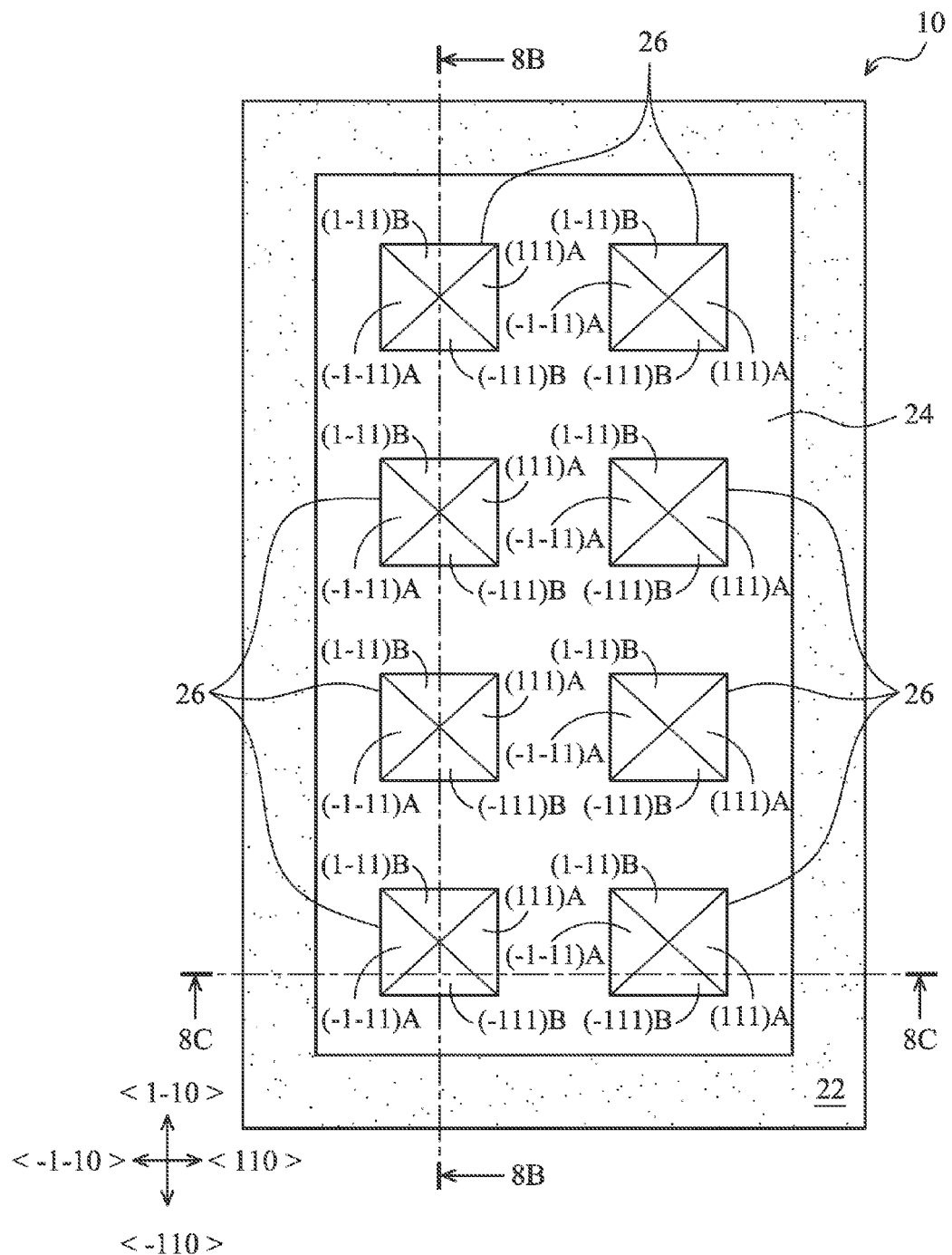

Referring to FIG. 8A, a portion of one of the recesses 24 is illustrated. A hetero-epitaxy is performed to grow GaAs in recess 24 and on silicon, so that the pyramid-shaped nano islands 26 (the squares in recess 24) are formed (please also refer to FIGS. 8B and 8C). The four facets of the pyramid have surface orientations (1-11)B, (-111)B, (-1-11)A, and (111)A. Facets (1-11)B and (-111)B face the long sides of recess 24, while facets (-1-11)A and (111)A face the short sides of recess 24.

Figure 8B:
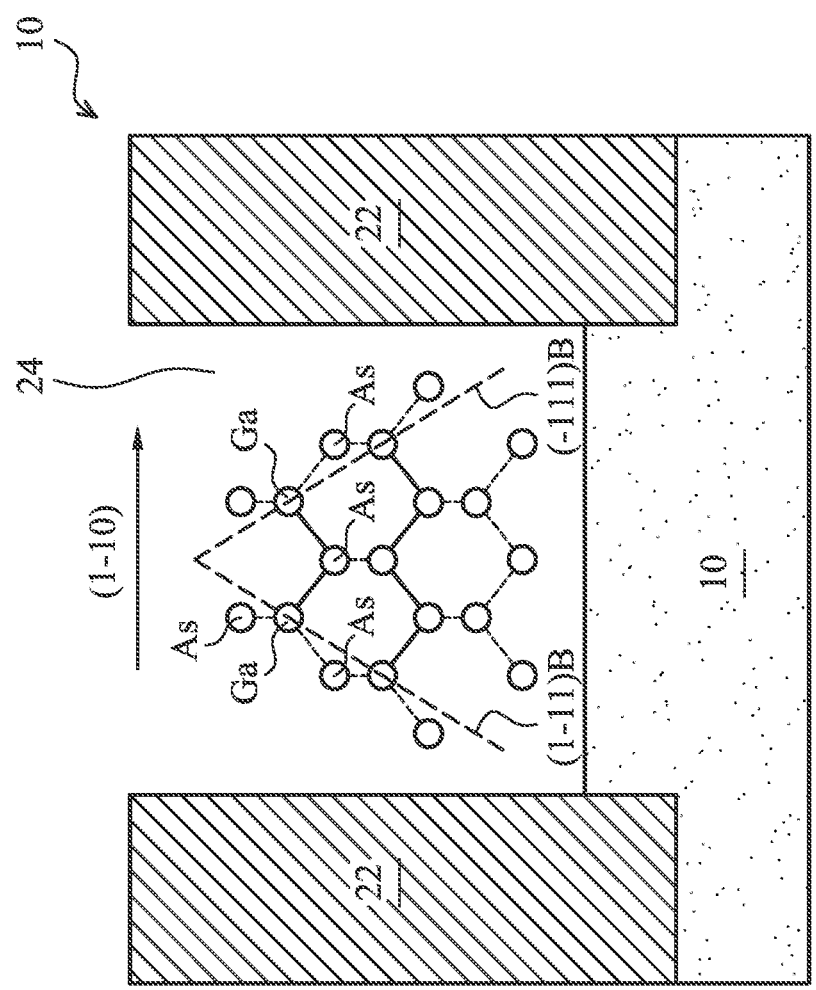

FIG. 8B illustrates a cross-sectional view of the structure shown in FIG. 8A, wherein the cross-sectional view is taken along a vertical plane crossing line 8B-8B in FIG. 8A. Facets (-1-11)A and (111)A (not shown in FIG. 8B) are thus the facets facing into and facing out of the paper, respectively, while facets (1-11)B and (-111)B are the facets facing top-left and top-right, respectively. The (1-11)B and (-111)B facets are illustrated using dotted lines, with (1-11)B and (-111)B facets being on planes extending perpendicular to the paper and crossing the dotted lines.

Figure 8C:
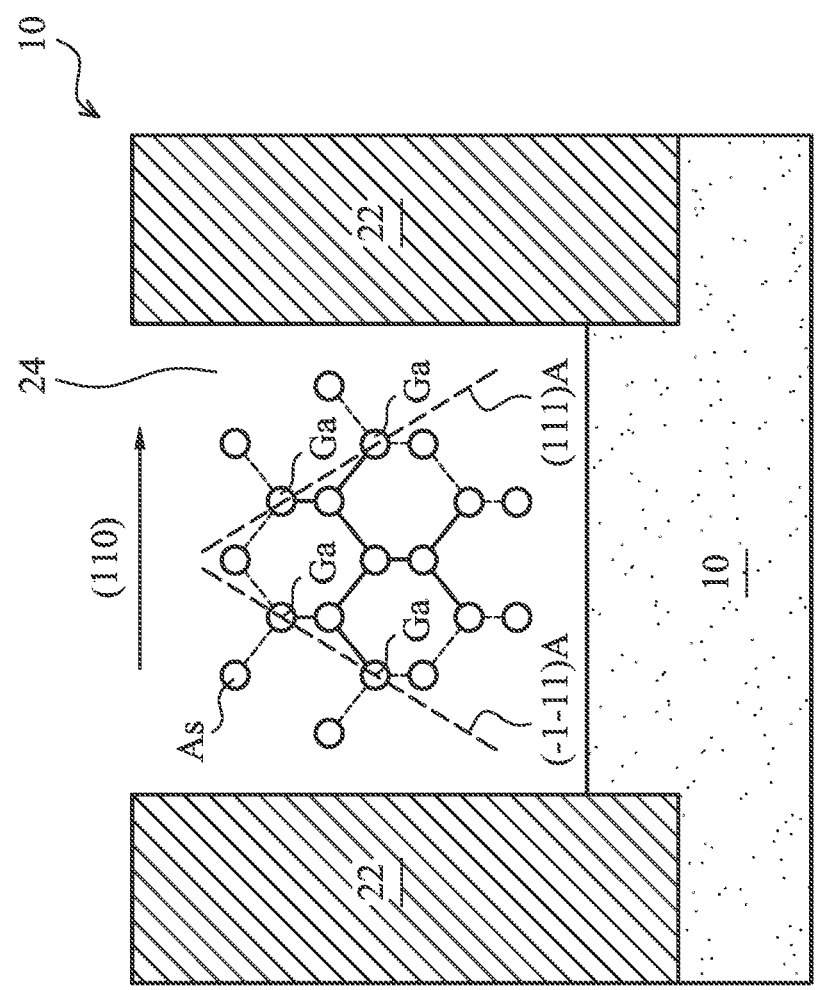

FIG. 8C illustrates a cross-sectional view of the structure shown in FIG. 8A, wherein the cross-sectional view is taken along a vertical plane crossing line 8C-8C in FIG. 8A. The respective facets are marked on FIG. 8C, and may be found from FIG. 8A.

With the orientations of substrate 20 and recesses 24 as shown in FIGS. 7 through 8C, B facets have a small defect density than the A facets. This may be achieved, for example, by adopting a relatively low substrate temperature and/or a relatively high V-to-III flow ratio. In an exemplary embodiment, the V-to-III ratio is greater than about 30, or even greater than about 100. The substrate temperature may be lower than about 400° C., and may be between about 200° C. and about 400° C., or between about 300° C. and about 400° C., or even lower than about 300° C. With such process conditions, the respective B facets have fewer defects than A facets. Although in this case, A facets have higher defect densities, the A facets will join the sidewalls of STI regions 22 quickly, and the high-density facets are stopped. The overall quality of the grown GaAs films is thus improved.

Figure 9:
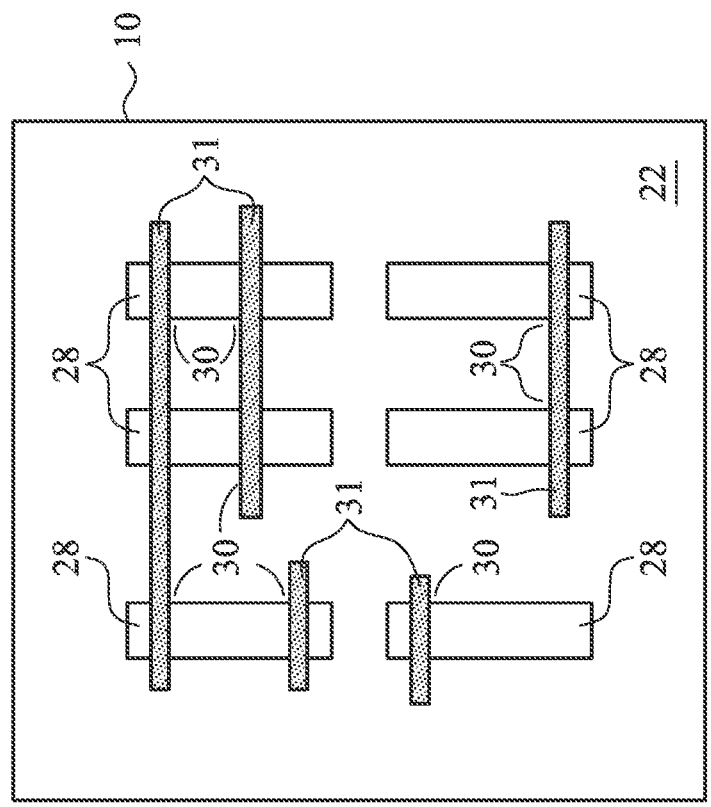

After the nucleation stage, the formation of GaAs films is continued. After the formation of GaAs films 28 as shown in FIG. 9, MOS devices 30 are formed. Again, the channel length direction of MOS devices 30 may be in the long-side direction of recesses 24, and substantially all MOS devices 30 (in a same wafer) that are formed on the epitaxial GaAs may have their gate electrodes 31 extending in a same direction, and may be parallel to the short sides of recesses 24.

The embodiments have several advantageous features. By aligning the long sides of recesses on a same chip/wafer in a same direction, and by adjusting process conditions for epitaxially growing GaAs in the recesses according to the direction of the long sides, the defects in the resulting GaAs films can be suppressed, and high-quality GaAs films can be grown.

Although the embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming recesses by removing top portions of a semiconductor substrate between opposite sidewalls of a plurality of isolation regions, wherein all long sides of all recesses in the semiconductor substrate extend in a same direction; and
performing an epitaxy to grow a III-V compound semiconductor material using one of a first process condition and a second process condition based on a long-side direction of the recesses, wherein:
the first process condition is used to epitaxially grow the III-V compound semiconductor material in the recesses using a first set of process parameters if the long sides of the recesses are parallel to a first direction of the semiconductor substrate; and
the second process condition is used to epitaxially grow the III-V compound semiconductor material in the recesses using a second set of process parameters if the long sides of the recesses are parallel to a second direction of the semiconductor substrate, wherein the first and the second sets of process parameters are chosen such that the III-V compound semiconductor material in the recesses has a higher defect density facing long sides of the respective recesses than facing short sides of the respective recesses.

2. The method of claim 1, wherein the epitaxy comprises growing a plurality of nano islands having first sides parallel to the long-side direction of the recesses, and second sides parallel to a short-side direction of the recesses, with the short-side direction being perpendicular to the long-side direction.

3. The method of claim 2, wherein the epitaxy further comprises continuing to grow the plurality of nano islands until the plurality of nano islands merges with each other.

4. The method of claim 2, wherein the defect densities of the III-V compound semiconductor material are found on the plurality of nano islands.

5. The method of claim 1, wherein the first direction is a <110> direction, and the second direction is a <1-10> direction, and wherein the first process condition comprises a first growth temperature, and the second process condition comprises a second growth temperature lower than the first growth temperature.

6. The method of claim 5, wherein the first growth temperature is higher than 400° C., and the second growth temperature is lower than 400° C.

7. The method of claim 1, wherein the first direction is a <110> direction, and the second direction is a <1-10> direction, and wherein the first process condition comprises a first V-to-III flow ratio, and the second process condition comprises a second V-to-III flow ratio higher than the first V-to-III flow ratio.

8. The method of claim 1 further comprising forming MOS devices at surfaces of the III-V compound semiconductor material that is grown from the recesses, wherein substantially all MOS devices extend in an additional direction perpendicular to the same direction.

9. The method of claim 1, wherein the III-V compound semiconductor material is GaAs.

10. A method comprising:
   forming a first plurality of shallow trench isolation (STI) regions in a first silicon substrate;
   etching the first silicon substrate to form first recesses between the first plurality of STI regions, wherein the first recesses have long sides and short sides shorter than the respective long sides, and the long sides extend in a same first direction of the first silicon substrate; and
   performing an epitaxy using a first process condition based on long-side directions of the first recesses, wherein the first process condition is used to epitaxially grow first III-V semiconductor films in the first recesses such that the first III-V semiconductor films in the first recesses have a higher defect density facing long sides of the respective first recesses than facing short sides of the respective first recesses.

11. The method of claim 10, wherein the first III-V semiconductor films comprise GaAs.

12. The method of claim 10, wherein the epitaxy comprises growing the first III-V semiconductor films as nano islands having sides parallel to the long sides and the short sides, and the defect density are found on facets of the nano islands.

13. The method of claim 10 further comprising:
   forming a second plurality of STI regions in a second silicon substrate, wherein the second silicon substrate has a same surface orientation as the first silicon substrate;
   etching the second silicon substrate to form second recesses between the second plurality of STI regions, wherein the second recesses have long sides extending in a same second direction of the second silicon substrate; and
   performing an additional epitaxy using a second process condition based on long-side directions of the second recesses, wherein the second process condition is used to epitaxially grow second III-V semiconductor films in the second recesses such that the second III-V semiconductor films in the second recesses have a higher defect density facing long sides of the respective second recesses than facing short sides of the respective second recesses.

14. The method of claim 13, wherein the same first direction is a <110> direction of the first silicon substrate, and the same second direction is a <1-10> direction of the second silicon substrate, and the first process condition comprises a first growth temperature, the second process condition comprises a second growth temperature lower than the first growth temperature.

15. The method of claim 13, wherein the same first direction is a <110> direction of the first silicon substrate, and the same second direction is a <1-10> direction the second silicon substrate, and the first process condition comprises a first V-to-III flow ratio, the second process condition comprises a second V-to-III flow ratio higher than the first V-to-III flow ratio.

16. A method of forming an integrated circuit structure, the method comprising:
   etching portions of a first silicon substrate between a first plurality of shallow trench isolation (STI) regions to form first recesses, wherein the first recesses have long sides extending in a first direction of the first silicon substrate;
   etching portions of a second silicon substrate between a second plurality of STI regions to form second recesses, wherein the second recesses have long sides extending in a second direction of the second silicon substrate, and the first direction and the second direction are perpendicular directions;
   performing a first epitaxy using a first process condition to grow first GaAs films in the first recesses such that the first GaAs films in the first recesses have a higher defect density facing long sides of the respective first recesses than facing short sides of the respective first recesses; and
   performing a second epitaxy using a second process condition to grow second GaAs films in the second recesses such that the second GaAs films in the second recesses have a higher defect density facing long sides of the respective second recesses than facing short sides of the respective second recesses, wherein the first process condition comprises a first temperature and a first As-to-Ga flow ratio, and the second process condition comprises a second temperature and a second As-to-Ga flow ratio.

17. The method of claim 16, wherein the first direction is a <110> direction of the first silicon substrate, and the second direction is a <1-10> direction of the second silicon substrate, and the second temperature is different from the first temperature.

18. The method of claim 17, wherein the second temperature is lower than the first temperature.

19. The method of claim 16, wherein the first direction is a <110> direction of the first silicon substrate, and the second direction is a <1-10> direction of the second silicon substrate, and the second As-to-Ga flow ratio is different from the first As-to-Ga flow ratio.

20. The method of claim 19, wherein the second As-to-Ga flow ratio is higher than the first As-to-Ga flow ratio.

\* \* \* \* \*